United States Patent
Yuda et al.

(10) Patent No.: US 6,851,384 B2
(45) Date of Patent: Feb. 8, 2005

(54) REMOTE PLASMA APPARATUS FOR PROCESSING SUBSTRATE WITH TWO TYPES OF GASES

(75) Inventors: Katsuhisa Yuda, Tokyo (JP); Hiroshi Nogami, Tokyo (JP)

(73) Assignees: NEC Corporation (JP); Anelva Corporation (JP)

( * ) Notice: Subject to any disclaimer, the term of this patent is extended or adjusted under 35 U.S.C. 154(b) by 11 days.

(21) Appl. No.: 09/820,149

(22) Filed: Mar. 28, 2001

(65) Prior Publication Data

US 2002/0000202 A1 Jan. 3, 2002

(30) Foreign Application Priority Data

Jun. 29, 2000 (JP) ...................................... 2000-196619

(51) Int. Cl.[7] .............................................. H01L 21/00
(52) U.S. Cl. ............................ 118/723 ER; 156/345.35
(58) Field of Search ...................... 148/723 ER, 723 R, 148/723 IR, 723 ME; 156/345.36, 345.43, 345.48, 345.35

(56) References Cited

U.S. PATENT DOCUMENTS

| | | | | |
|---|---|---|---|---|
| 5,015,331 A | * | 5/1991 | Powell | 204/298.34 |
| 5,304,250 A | * | 4/1994 | Sameshima et al. | 118/723 ER |
| 5,472,508 A | * | 12/1995 | Saxena | 118/723 E |
| 5,935,334 A | | 8/1999 | Fong et al. | 118/723 |
| 6,026,762 A | | 2/2000 | Kao et al. | 118/723 |
| 6,039,834 A | | 3/2000 | Tanaka et al. | 156/345 |
| 6,383,299 B1 | * | 5/2002 | Yuda et al. | 118/715 |

FOREIGN PATENT DOCUMENTS

| | | | | |
|---|---|---|---|---|
| JP | 8-045858 | | 2/1996 | ......... H01L/21/205 |
| JP | 8/167596 | | 6/1996 | ....... H01L/21/3065 |
| JP | 8-194942 | | 7/1996 | ............ G11B/5/84 |
| JP | 11168094 A | * | 6/1999 | ........... H01L/21/31 |

* cited by examiner

*Primary Examiner*—Gregory Mills
*Assistant Examiner*—Michelle Crowell
(74) *Attorney, Agent, or Firm*—Hayes Soloway P.C.

(57) ABSTRACT

In a plasma CVD apparatus, a plate formed with a plurality of perforated holes is arranged to separate a plasma generation region and a processing region. The aperture ratio of the perforated holes to the plate is not greater than five percent. Plasma including radicals and excited species is generated from an oxygen ($O_2$) gas in the plasma generation region, then the radicals and excited species flow into the processing region through the perforated holes. A monosilane ($SiH_4$) gas is also supplied into the processing region, but the backward flow of the monosilane gas into the plasma generation region is suppressed by the plate. In the processing region, the radicals and the excited species and the monosilane gas result in a gas phase reaction that yields the silicon dioxide film formed on the substrate or the wafer with high quality.

27 Claims, 16 Drawing Sheets

REMOTE PLASMA APPARATUS FOR PROCESSING SUBSTRATE WITH TWO TYPES OF GASES

BACKGROUND OF THE INVENTION

This invention relates to substrate processing and, more particularly, to a plasma chemical vapor deposition (plasma CVD) by using a reaction between a gas and radicals obtained from another gas.

As is well known, formation of a film or a layer is one of the primary steps in the fabrication of modern semiconductor devices and, such a film or a layer can be deposited by a CVD process, for example, a thermal CVD process or a plasma CVD process (plasma-enhanced CVD process). Especially, a remote plasma CVD process is an improved one of plasma CVD processes and can form a desired thin film on a substrate or a wafer with suppression of damage arising from plasma.

In an exemplary remote plasma CVD process, two types of gases are used. One type of gas is a plasma material gas that is decomposed, and/or energized, and changed into plasma including radicals and excited species, while another type of gas is a deposition material gas that reacts with the radicals and excited species in a gas phase reaction. For example, the former is oxygen ($O_2$) gas while the latter is monosilane or silane ($SiH_4$) gas. In a remote plasma CVD process, oxygen gas is at first energized and changed into plasma within a plasma generation region. The plasma includes excited species and radicals which are excited oxygen atoms, excited oxygen molecules, oxygen atoms, oxygen molecules, and ozone molecules. The radicals and excited species included in the plasma are supplied into a substrate processing region that is separated or isolated from the plasma generation region. Independently of the excited species and radicals, monosilane gas is also supplied into the substrate processing region, where a gas phase reaction between the oxygen gas and the monosilane gas occurs. The gas phase reaction produces precursors which are for silicon dioxide ($SiO_2$) and are for example $SiH_x$, $SiH_xO_y$, $SiO_y$, and so on. The precursors are adhered to a substrate or a wafer arranged within the substrate processing region and are subjected to oxidation, thermal dissociation and so forth, so that the silicon dioxide film are formed on the substrate or the wafer. Silicon nitride ($Si_3N_4$) film and an amorphous silicon (a-Si) film can be formed in the way similar to the above-mentioned remote plasma CVD process.

Some types of apparatuses and methods for processing with remote plasma CVD techniques are shown in Japanese Patent Laid-Open Nos. H8-167596 and H8-194942, which are incorporated herein by reference.

One problem that arises during such remote plasma CVD processes is that a deposition material gas, such as silane gas, flows back into the plasma generation region from the substrate processing region. In case of silane gas of the deposition material gas, the backward flow of the deposition material gas results in excess formation of hydrogen atoms (H) and/or hydrogen molecules ($H_2$), so that the silicon dioxide film formed on the substrate or wafer includes a great deal of H or OH. The problem is discussed in Japanese Patent Laid-Open No. H8-45858, which is incorporated herein by reference.

SUMMARY OF THE INVENTION

It is therefore an object of the present invention to provide an improved remote plasma apparatus which can suppress the backward flow of the deposition material gas, such as monosilane gas.

According to one aspect of the present invention, a remote plasma apparatus comprises a body, an energy source, a plate, and a substrate supporter. The body defines a cavity comprising a plasma generation region and a processing region and has first and second gas inlets. The first gas inlet communicates with the plasma generation region to introduce a first gas into the plasma generation region directly or indirectly, while the second gas inlet communicates with the processing region to supply a second gas into the processing region directly or indirectly.

The energy source is arranged and adapted to apply energy within the plasma generation region to generate, from the first gas, plasma including radicals. The energy source may be a radio frequency (RF) supplier or a microwave power supplier.

The plate is arranged between the plasma generation region and the processing region and is formed with a plurality of perforated holes through which the radicals pass. The plate is designed such that aperture ratio of the perforated holes to the plate is not greater than five percent. Each perforated hole may have a diameter not larger than three millimeters.

The substrate supporter is arranged within the processing region and is adapted to support a substrate to be processed by using a reaction between the radicals passing through the perforated holes and the second gas supplied through the second gas inlet.

In the above structure where the body has an inner side wall, the plate may be arranged with no gap left between the plate and the inner side wall.

The remote plasma apparatus can be used in a film forming process where an oxygen-containing gas is supplied as the first gas into the plasma generation region through the first gas inlet, while a silicon-containing gas is supplied as the second gas into the processing region. For example, the oxygen-containing gas is oxygen ($O_2$) gas, while the silicon-containing gas is monosilane or silane ($SiH_4$) gas.

With the above structure, the remote plasma apparatus can suppress the backward flow of the deposition material gas into the plasma generation region. Therefore, the excess formation of hydrogen atoms (H) and/or hydrogen molecules ($H_2$) is also suppressed, namely, the high quality silicon dioxide film can be obtained.

These and other aspects of the present invention, as well as its advantages and features are described as preferred embodiments in more detail in conjunction with the text below and attached figures.

DESCRIPTION OF THE PREFERRED EMBODIMENTS

Figure 1:
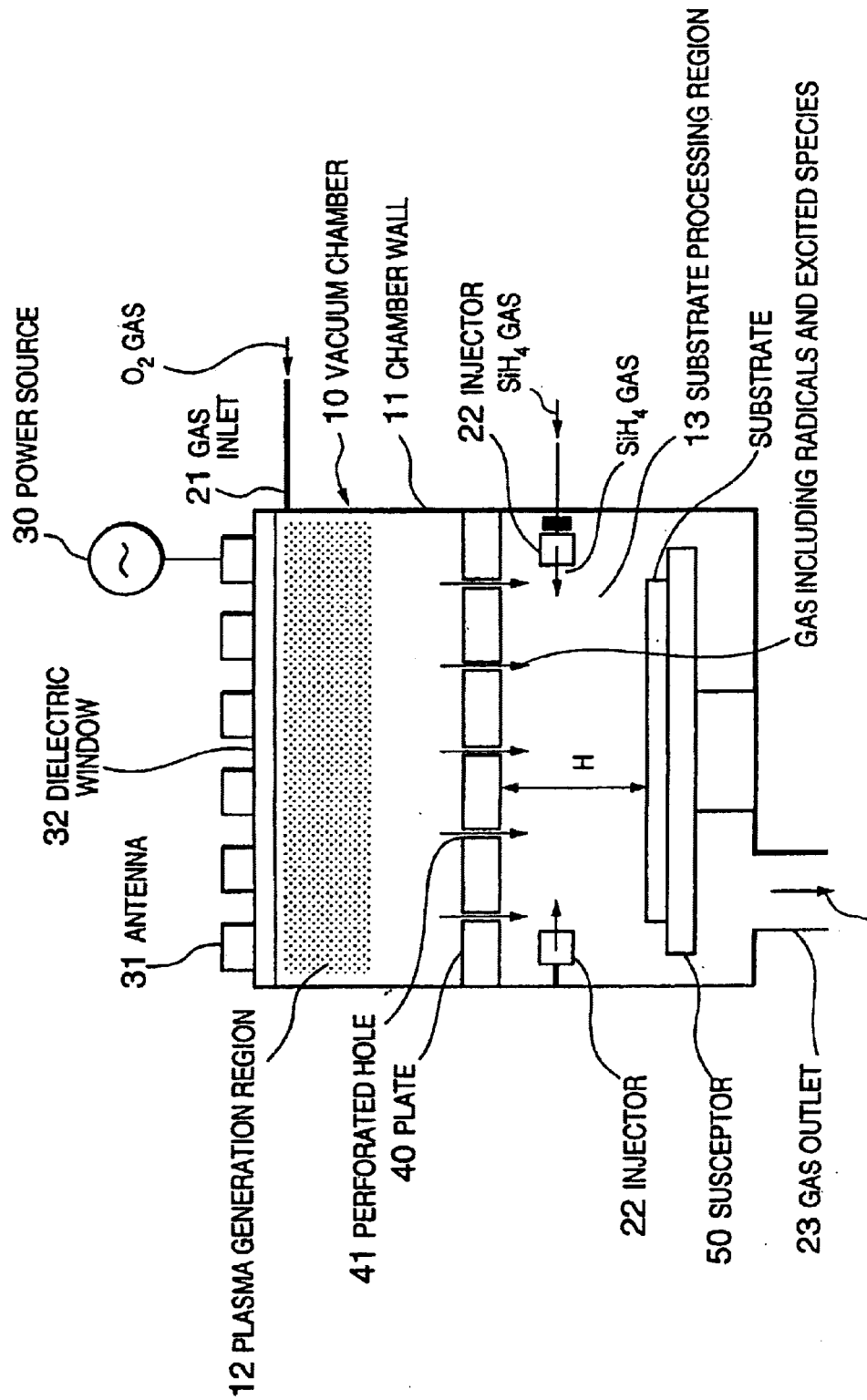
FIG. 1 is a schematic, vertical, cross-sectional view of a remote plasma apparatus, such as a remote plasma CVD apparatus, in accordance with one embodiment of the present invention.

Referring to FIG. 1, a remote plasma apparatus according to an embodiment of this invention is a remote plasma CVD apparatus where oxygen gas ($O_2$) of a plasma material gas and silane ($SiH_4$) gas of a deposition material gas are used to deposit a silicon dioxide film on a substrate or a wafer. As mentioned above, the plasma material gas is decomposed and changed into plasma including radicals and excited species, while the deposition material gas reacts with the radicals and excited species in the gas phase reaction. To obtain a silicon dioxide film, the plasma material gas may be another oxygen-containing gas, such as a nitrous oxide gas or a nitric oxide gas, while the deposition material gas may be another silicon-containing gas, such as a disilane gas or a higher silane gas, or a liquid silicon material, such as a TEOS (tetraethoxysilane). To obtain other films, the plasma material gas and the deposition material gas may be other kinds of gases which can be selected by a skilled person.

The illustrated remote plasma CVD apparatus comprises a vacuum chamber 10 having a chamber wall 11. The vacuum chamber 10 defines a cavity comprising a plasma generation region 12 and a substrate processing region 13. The vacuum chamber 10 is provided with a gas inlet 21, a ring-shaped injector 22, and a gas outlet or an exhaust outlet 23. The gas inlet 21 is for introducing oxygen ($O_2$) gas into the plasma generation region 12, while the injector 22 is for dispersing or injecting silane ($SiH_4$) gas into the substrate processing region 13. The gas outlet 23 is connected with an exhaust emission control device or an external vacuum pump (not shown) and is for exhausting or evacuating, to the outside of the apparatus, the remainder of the gas mixture that is not deposited in a film.

On the upper side of the illustrated vacuum chamber 10, an antenna 31 electrically connected to a power source 30 and a dielectric window 32 are arranged. The power source 30 can supply a high-frequency energy into the plasma generation region through the antenna 31 and the dielectric window 32, which may be other high-frequency energy transparent material. As understood from the discharge structure for generating plasma, the remote plasma CVD apparatus applies an induction coupled discharge. Instead of the induction coupled discharge, the remote plasma CVD apparatus may apply a capacitively-coupled discharge or a microwave discharge with a suitable discharge mechanism arranged on the vicinity of the plasma generation region.

The illustrated remote plasma CVD apparatus further comprises a plate 40 and a susceptor 50. The illustrated plate 40 is formed with a plurality of perforated holes 41 and is arranged between the plasma generation region 12 and the substrate processing region 13 with no gap left between the plate 40 and the chamber wall 11. In particular, the plate 40 of this embodiment defines the plasma generation region 12 and the substrate processing region 13 in cooperation with the chamber wall 11. The susceptor 50 is for supporting a substrate or wafer and is also called a wafer support pedestal.

Figure 2:
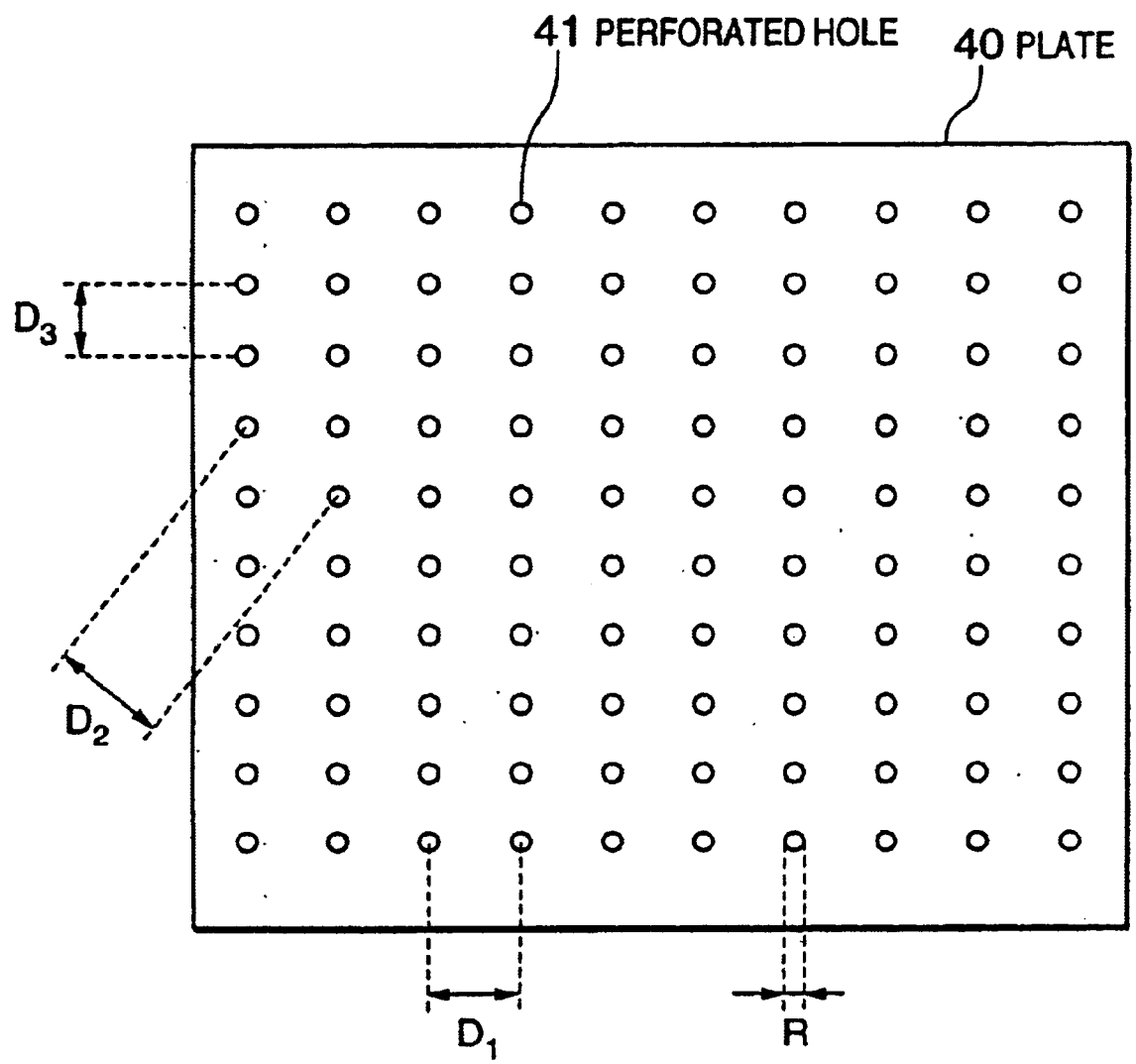
FIG. 2 is a plain view of the plate arranged within the vacuum chamber of the remote plasma CVD apparatus depicted in FIG. 1.

Referring to FIG. 2, the example of the plate 40 is rectangular and has a plane area of 400 mm×500 mm. In addition, the plate 40 has one hundred perforated holes 41. Each of the perforated holes 41 has a cylindrical shape where a diameter is 11 mm and a length is 20 mm, so that aperture ratio of the perforated holes 41 to the entire plate 40 is not greater than five percent. The perforated holes 41 may have other shapes. The plate 40 may be circular shaped and the vacuum chamber 10 may have a cylindrical chamber wall.

In the remote plasma CVD apparatus with the plate 40, the pressure of the plasma generation region 12 is higher than the pressure of the substrate processing region 13 under the condition of the substrate processing, because the plate is designed to meet the aperture ratio. For example, if $O_2$ gas is introduced into the plasma generation region 12 at flow rate of 1SLM and the pressure of the substrate processing region 13 is controlled with the vacuum pump (not shown) to be 30 Pa, the pressure of the plasma generation region 12 becomes 35 Pa.

The higher pressure of the region 12 results in the suppression of the silane gas flowing back into the plasma generation region 12 from the substrate processing region 13. That is, the plate 40 with the perforated holes 41 can suppress the silane gas flowing back into the plasma generation region 12 from the substrate processing region 13. Herein, the arrangement of the illustrated perforated holes 41 is uniform in the plane of the plate 40, but the plate 40 may have another arrangement where the number of the perforated holes 41 at the center of the plate 40 is larger than one of the perforated holes 41 at the peripheral part of the plate 40.

In order to more effectively suppress the back flow of the silane gas, the diameter R of the perforated hole 41 can be smaller than one of the illustrated perforated hole 41. In detail, each perforated hole 41 may have a diameter not larger than three millimeter. For example, the plate 40, formed with one hundred perforated holes 41 and having an area of 400 mm×500 mm, is designed so that each perforated holes 41 has a cylindrical shape where a diameter is 2 mm and a length is 10 mm. In this case, if $O_2$ gas is introduced into the plasma generation region 12 at flow rate of 1SLM and the pressure of the substrate processing region 13 is controlled with the vacuum pump (not shown) to be 30 Pa, the pressure of the plasma generation region 12 becomes 58 Pa. Thus, the pressure difference between the regions 12 and 13 becomes larger, if the diameter of the perforated hole 41 becomes smaller under the condition where the length of the perforated hole 41 is unchanged. The large pressure difference causes the back flow of the silane gas to be suppressed effectively.

Figure 3:
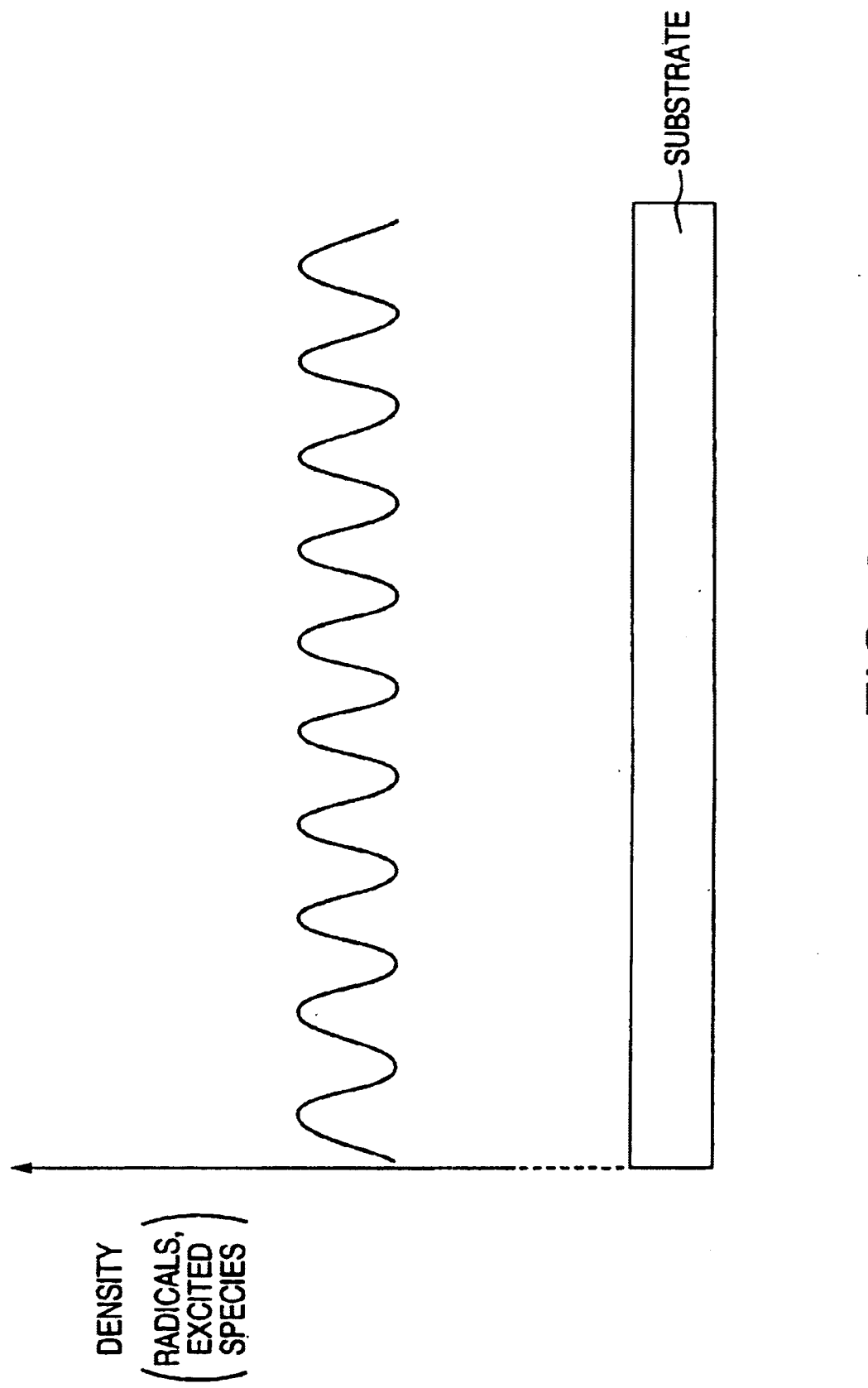
FIG. 3 is a graph schematically showing undesirable distribution of the radicals and the excited species which are included in plasma.

It is here assumed that there is a large interval between neighboring ones of the perforated holes 41 under the condition that the aperture ratio and the diameter of the perforated holes are restricted. Under the assumption, the gas including the radicals and the excited species has undesirable density distribution at the vicinity of the substrate to be processed, as shown in FIG. 3. Taking the influence of the hole interval upon the gas density distribution, the intervals (D1, D2, D3) shown in FIG. 2 may be shorter than the distance (H) shown in FIG. 1 between the plate 40 and the substrate supported on the susceptor 50, in order to obtain more uniform gas distribution.

Now, explanation will be made about the film forming process in the example of the remote plasma CVD apparatus according to the above-mentioned embodiment. In the example of the remote plasma CVD apparatus, the plate 40 is formed with one hundred perforated holes 41 and has a rectangular shape whose area is 400 mm×500 mm. Each perforated hole 41 has a cylindrical shape where a diameter is 2 mm and a length is 10 mm. The intervals D1, D2, and D3 between neighboring ones of the perforated holes 41 are 46 mm, 36 mm, 58 mm, respectively, while the distance H between the plate and the substrate supported on the susceptor 50 is 100 mm.

Into the vacuum chamber 10 kept in vacuum, the oxygen gas is introduced at flow rate of 1SLM and the pressure of the substrate processing region 13, especially, the pressure on the vicinity of the substrate is controlled with the vacuum pump (not shown) to be 30 Pa. In this embodiment, the pressure of the plasma generation region 12 becomes 58 Pa, because of the plate 40. That is, the pressure of the plasma generation region 12 is about twice pressure of the substrate processing region 13.

Under the condition, the antenna 31 is supplied with the high frequency energy from the power source 30, thereby the oxygen plasma is generated in the plasma generation region 12. The oxygen plasma includes excited species and radicals which are excited oxygen atoms, excited oxygen molecules, oxygen atoms, oxygen molecules, and ozone molecules, in addition to electrons and ions. It is noted here that the plasma density within the plasma generation region 12 is about $10^8 \sim 10^{10}$ cm$^{-3}$, while the plasma density between the plate 40 and the substrate supported on the susceptor 50 is less than $10^6$ cm$^{-3}$. Hence, very few electrons and ions practically reach the substrate processing region 13 and influence on the film forming.

Gas including the radicals and excited species is supplied through the perforated holes 41 and diffuses into the substrate processing region 13. Independently of the gas including the excited species and radicals, the monosilane gas is also supplied into the substrate processing region 13 at flow rate of 5 SCCM. The gas including the radicals and excited species and the monosilane gas react with each other, and result in producing precursors for silicon dioxide ($SiO_2$), for example, $SiH_x$, $SiH_xO_y$, $SiO_y$, and so on. The precursors are adhered to the substrate supported on the susceptor 50 and are subjected to oxidation, thermal dissociation and so forth, so that the silicon dioxide film are formed on the substrate.

With the structure, the almost no monosilane gas can flow back into the plasma generation region 12, because the pressure of the plasma generation region 12 is about twice pressure of the substrate processing region 13 as mentioned above. Therefore, the excess formation of hydrogen atoms (H) and/or hydrogen molecules ($H_2$) is also suppressed, namely, the high quality silicon dioxide film can be obtained.

As mentioned above, the plasma density between the plate 40 and the substrate supported on the susceptor 50 is controlled to be extremely low. The low plasma density results in very low plasma damage on the substrate 30, in comparison with the general parallel plate plasma CVD of the conventional configurations. The obvious advantage of the low plasma damage appears on the specific silicon surface which comprise the MOS interface. If the silicon dioxide film is deposited on a single crystal silicon substrate by the use of the general parallel plasma CVD, the density of the MOS interface state becomes $10^{11} \sim 10^{12}$ cm$^{-2}$ eV$^{-1}$. If the silicon dioxide film is deposited on a single crystal silicon substrate by the use of the remote plasma CVD according to the present invention, the density of the MOS interface state is controlled to be $10^{10}$ cm$^{-2}$ eV$^{-1}$ lower than that of general parallel plasma CVD.

Figure 4:
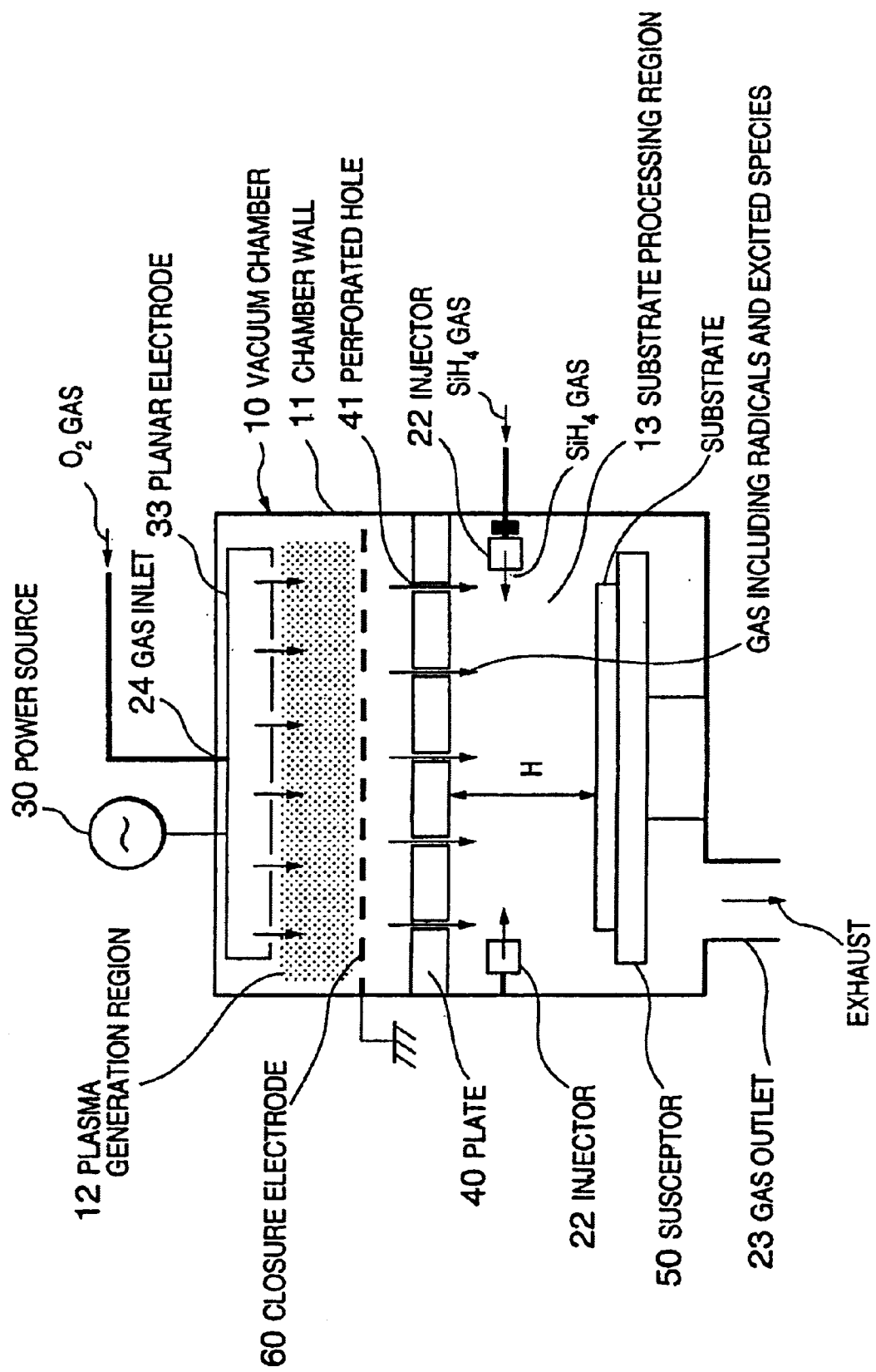
FIG. 4 is a schematic, vertical, cross-sectional view of a remote plasma apparatus, such as a remote plasma CVD apparatus, in accordance with another embodiment of the present invention.

Referring to FIG. 4, a modification of the remote plasma CVD apparatus illustrated in FIG. 1 comprises a gas inlet 24 and a planar electrode 33, instead of the gas inlet 21 and the antenna 31 and the dielectric window 32, and further comprises a closure electrode 60. The planar electrode 33 is electrically connected to the power source 30 and electrically delivers the high frequency energy into the plasma generation region 12. In addition, the illustrated planar electrode 33 is gas distribution structure, for example, an $O_2$ gas distribution manifold and is connected with the gas inlet 24. The closure electrode 60 is formed with a plurality of holes which the radicals and excited species pass through, and is electrically grounded. It is herein desirable that the diameter of the hole of the closure electrode 60 is substantially equal to or less than "Debye length" of the plasma to be generated in the plasma generation region 12.

Figure 5:
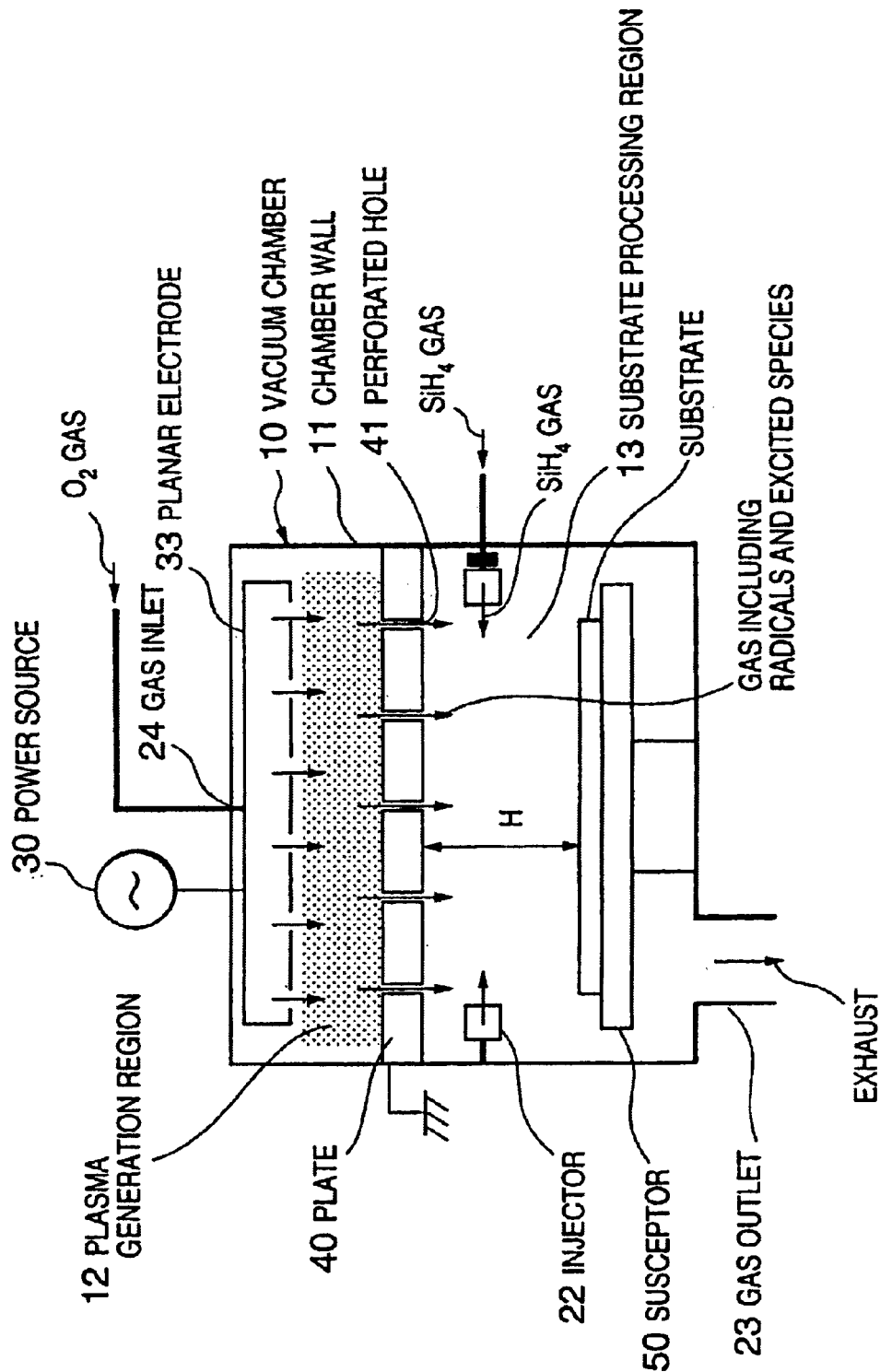
FIG. 5 is a schematic, vertical, cross-sectional view of a remote plasma apparatus, such as a remote plasma CVD apparatus, in accordance with another embodiment of the present invention.

Referring to FIG. 5, a modification of the remote plasma CVD apparatus illustrated in FIG. 4 comprises the plate 40 made of conductive material, such as metal. The plate 40 is electrically grounded and serves as a closure electrode. In this modification, each of the perforated holes 41 has the diameter which is substantially equal to or less than "Debye length" of the plasma to be generated in the plasma generation region 12.

It is assumed that the plate 40 is formed with one hundred perforated holes 41 and has a rectangular shape whose area is 400 mm×500 mm and each perforated holes 41 has a cylindrical shape where a diameter is 2 mm and a length is 10 mm. In addition, it is assumed that the oxygen gas is introduced into the vacuum chamber 10 at flow rate of 1SLM and if the pressure on the vicinity of the substrate is controlled with the vacuum pump (not shown) to be 30 Pa, resulting in that the pressure of the plasma generation region 12 becomes 58 Pa. Under the pressure conditions, if the high frequency energy of 13.56 MHz is provided at 1 W/cm$^3$, the oxygen plasma has the plasma density of about $10^8$ cm$^{-3}$ and the electron temperature of about $10^5$ K. In the oxygen plasma, Debye length is about 2 mm, which is substantially equal to the diameter of the perforated hole 41. The plate 40 with the above structure serves as the closure of the plasma and the prevention plate of the back flow of the monosilane gas.

Referring to FIGS. 6 through 9, a remote plasma CVD apparatus according to another embodiment of the present invention comprises the similar structure of the remote plasma CVD apparatus depicted in FIG. 5 except for an injection mechanism of the silane gas. Instead of the plate 40 and the injector 22, the remote plasma CVD apparatus illustrated in FIG. 6 comprises a plate 42 serving as a SiH$_4$ gas distribution structure. The plate 42 comprises a top portion 45, a bottom portion 46, a plurality of tube walls 47, and a plurality of gas injection holes 43, and defines a gas supplier plenum 44. The gas supplier plenum 44 makes the silane gas uniform in a plane, thereby resulting in uniformity in the distributed silane gas. The top portion 45 has a plurality of upper holes, while the bottom portion 46 has a plurality of lower holes. The tube walls 47 connect between the upper holes and the lower holes, respectively, and form perforated holes 41 which are separated or isolated from the gas supplier plenum 44.

Figure 10:
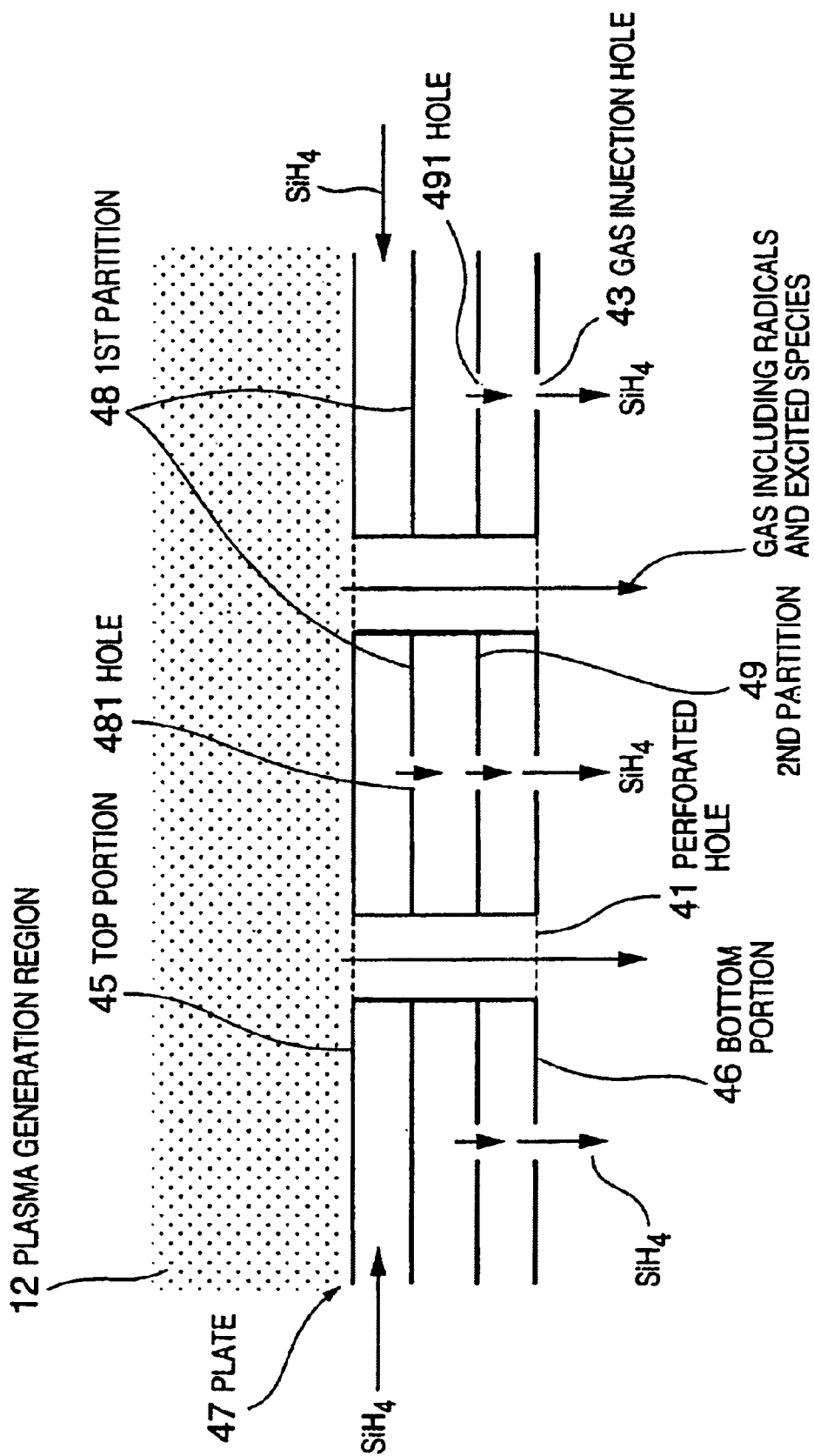
FIG. 10 is an illustrative cross-sectional view of a modification of the plate depicted in FIG. 6.
Figure 11:
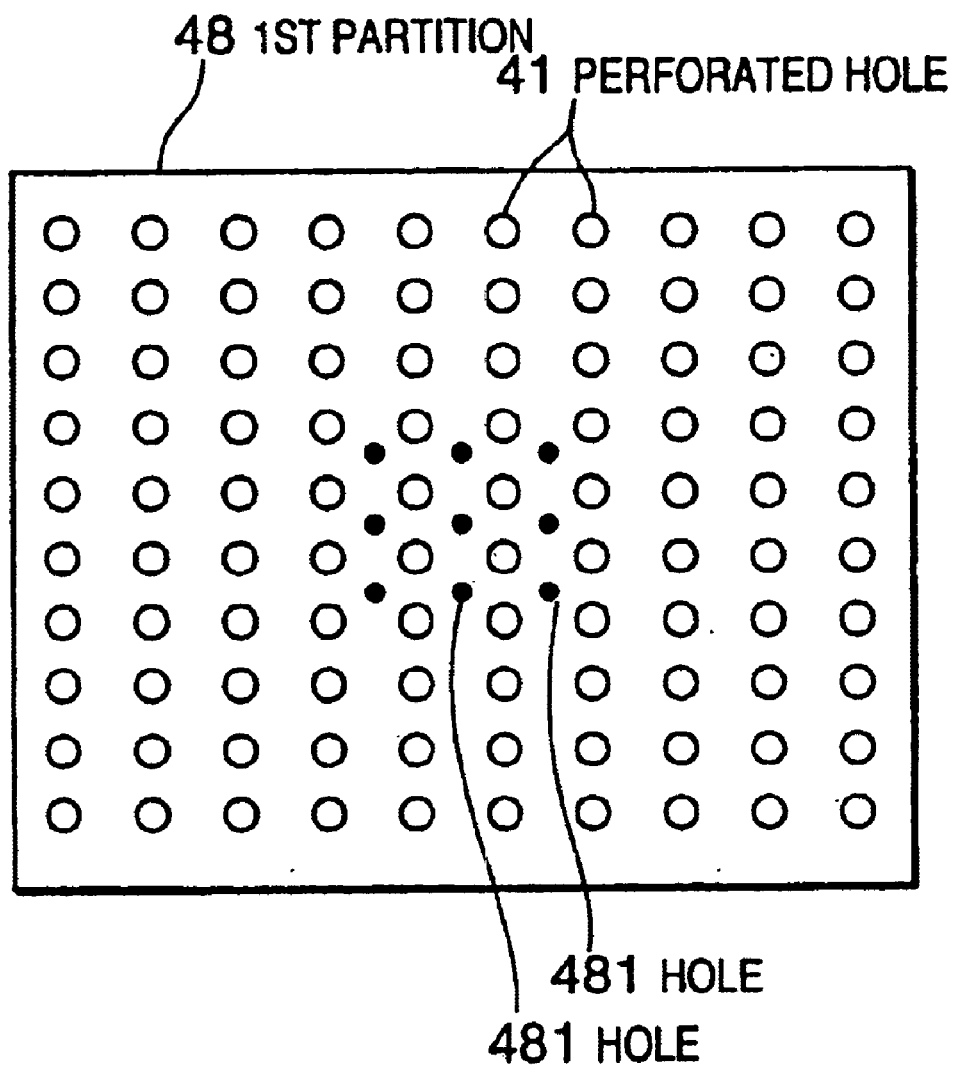
FIG. 11 is a bottom plain view of a first partition included in the modification depicted in FIG. 10.
Figure 12:
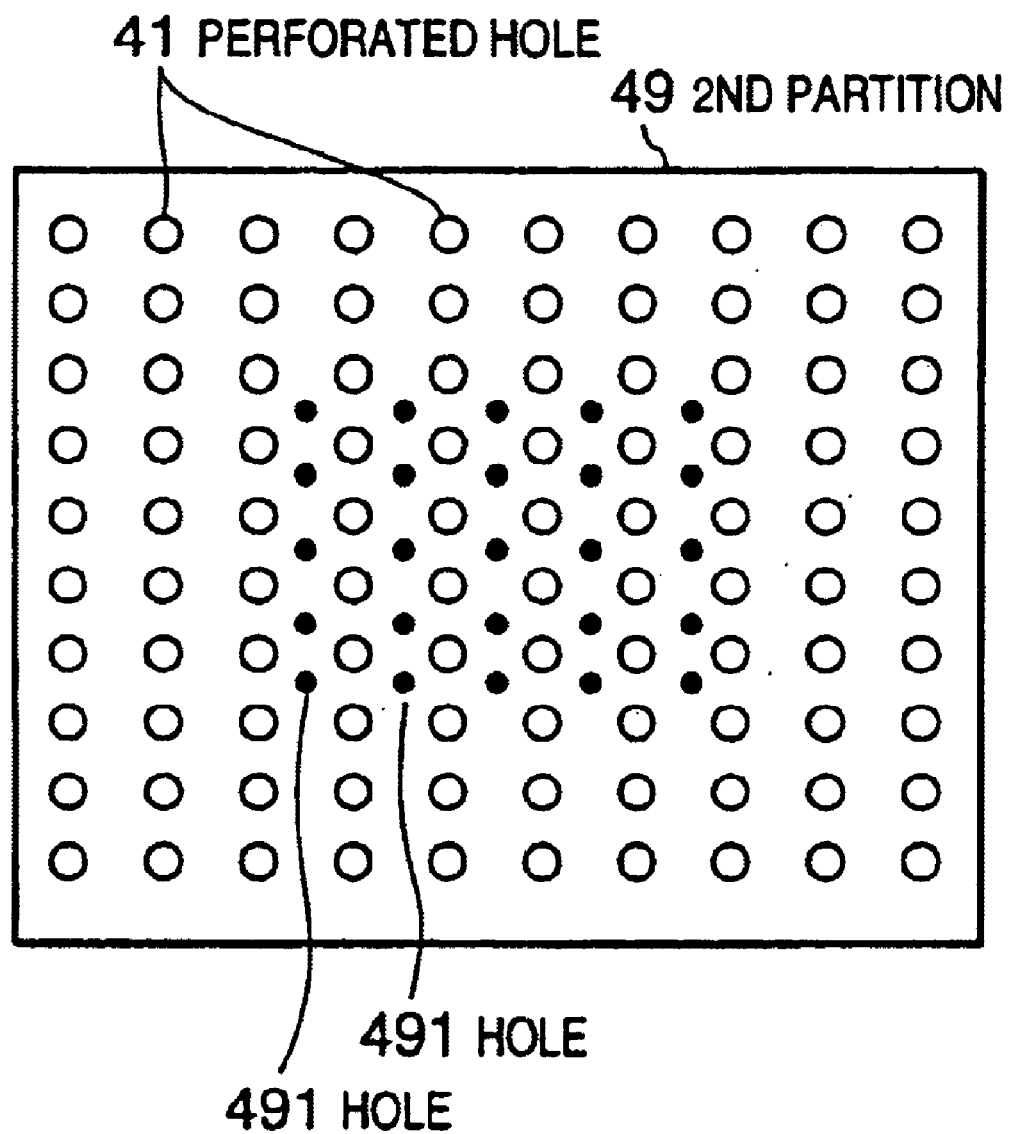
FIG. 12 is a bottom plain view of a second partition included in the modification depicted in FIG. 11.

In order to obtain more uniform SiH$_4$ gas distribution in the substrate processing region 13, the plate 42 further comprises first and second partitions 48 and 49 which are for dispersing the silane gas, as shown in FIGS. 10 through 12. To disperse the silane gas and obtain more uniform silane gas, the first partition 48 and the second partition 49 have a plurality of holes 481 and 491, and the number of the holes 481 is less than that of the holes 491. In detail, the number of the holes 481 illustrated in FIG. 11 is nine, while the number of the holes 491 illustrated in FIG. 12 is twenty five. That is, the ratio of the holes 481 to the holes 491 is nine twenty-fifth. In particular, the holes 481 of this embodiment are formed and concentrated on the center of the first partition 48. The silane gas supplied to a first space between the top portion 45 and the first partition 48 diffuses in the first space, passes through the holes 481 and flows into a second space between the first partition 48 and the second partition 49. The silane gas further spreads within the second space and then is injected into the substrate processing region 13, so that the more uniform SiH$_4$ gas distribution in the substrate processing region 13 is obtained. The number of the partition is not restricted to two, but may be one or greater than two.

Figure 6:
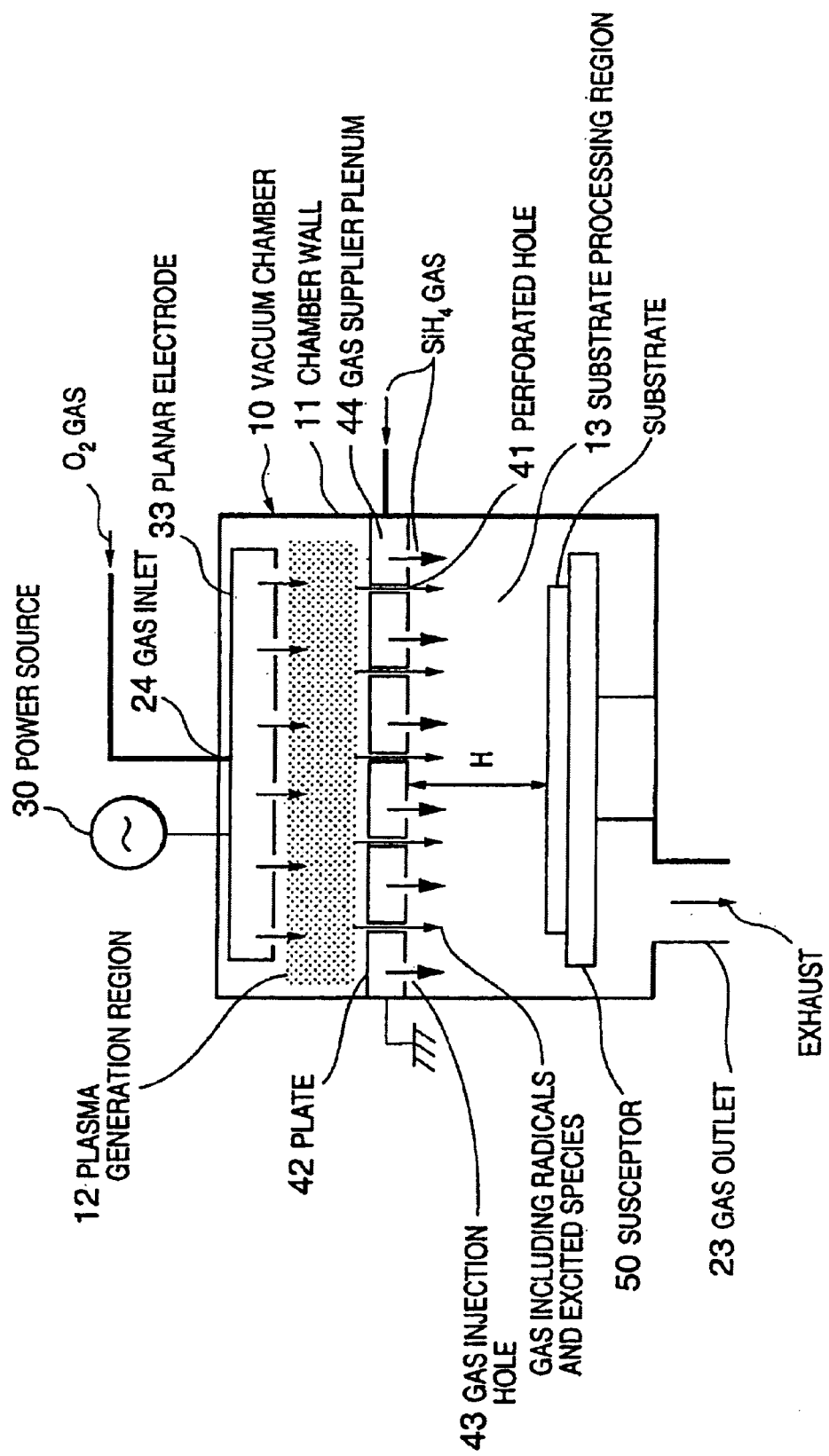
FIG. 6 is a schematic, vertical, cross-sectional view of a remote plasma apparatus, such as a remote plasma CVD apparatus, in accordance with another embodiment of the present invention.
Figure 7:
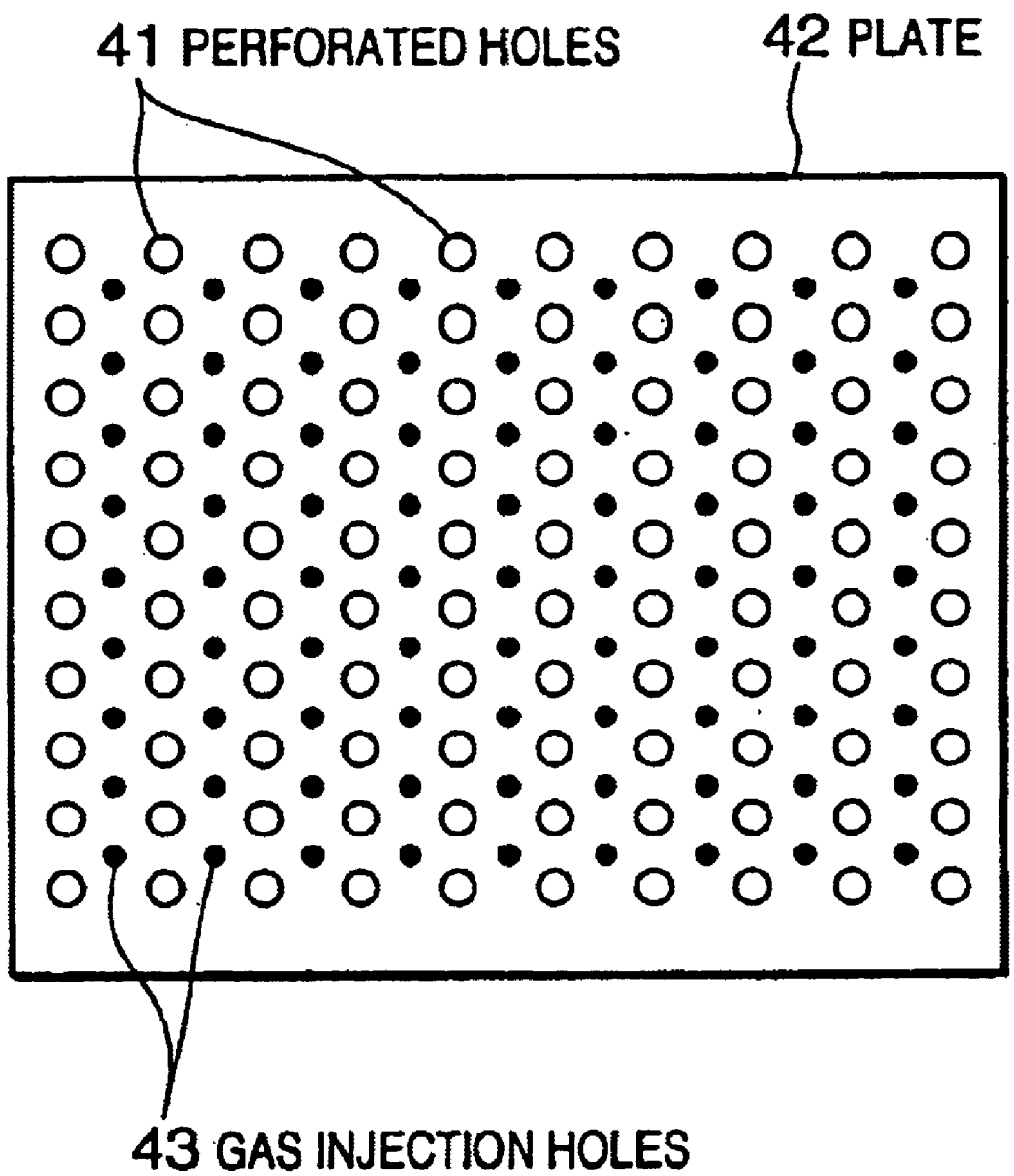
FIG. 7 is a bottom plain view of the plate depicted in FIG. 6.
Figure 8:
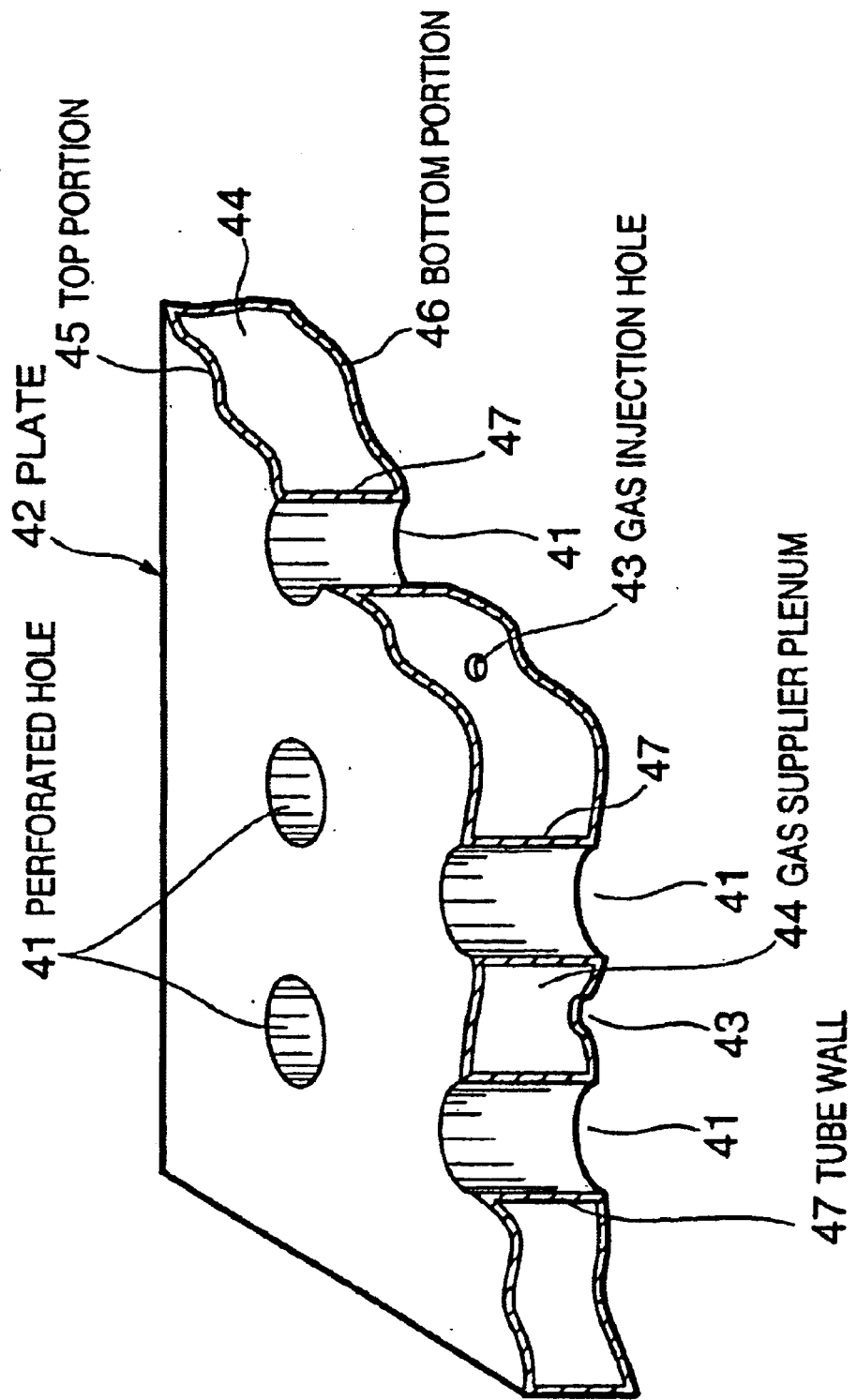
FIG. 8 is a partially enlarged, cross-sectional view of the plate depicted in FIG. 6.
Figure 9:
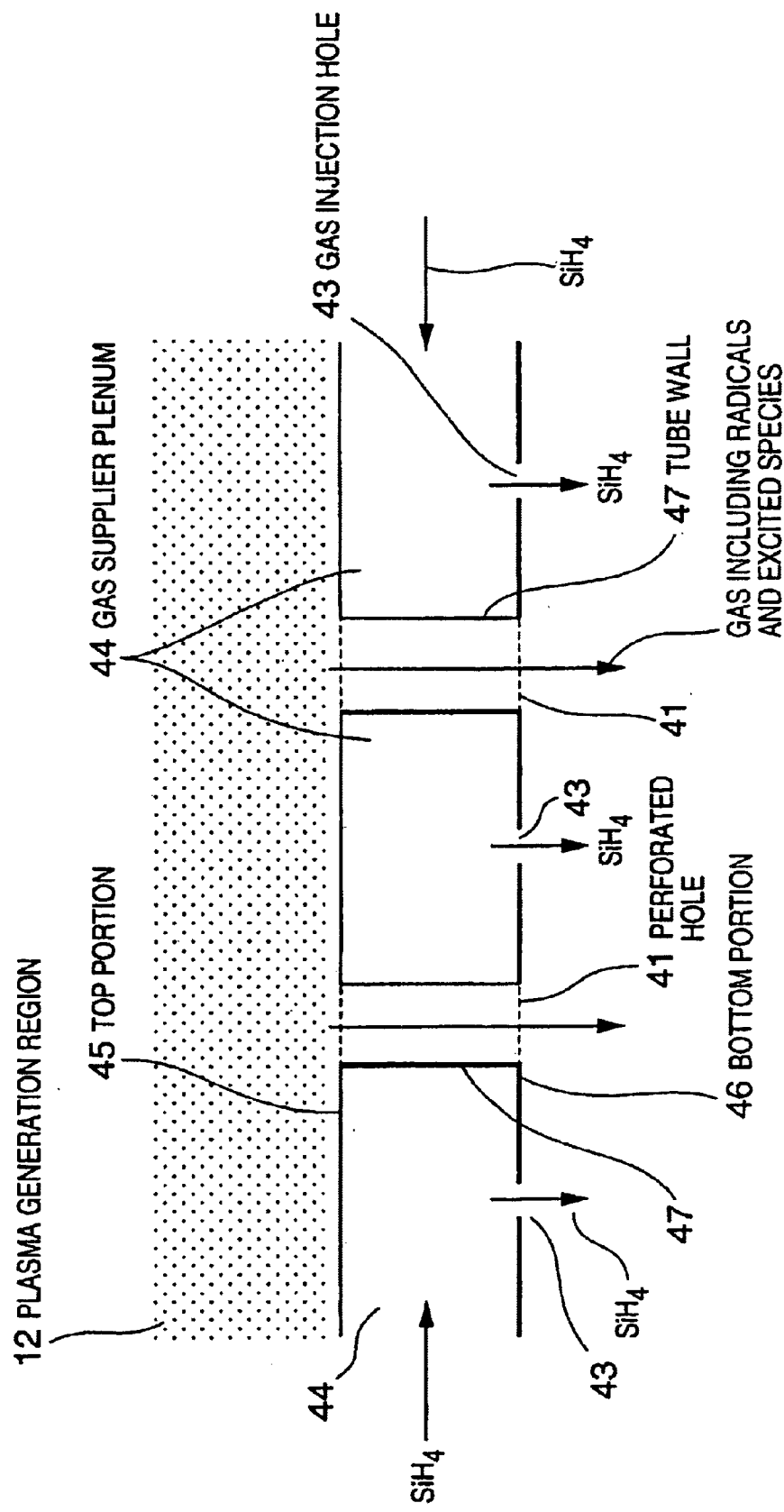
FIG. 9 is an illustrative cross-sectional view of the plate depicted in FIG. 6, which shows a flow of a deposition material gas and radicals and excited species.
Figure 13:
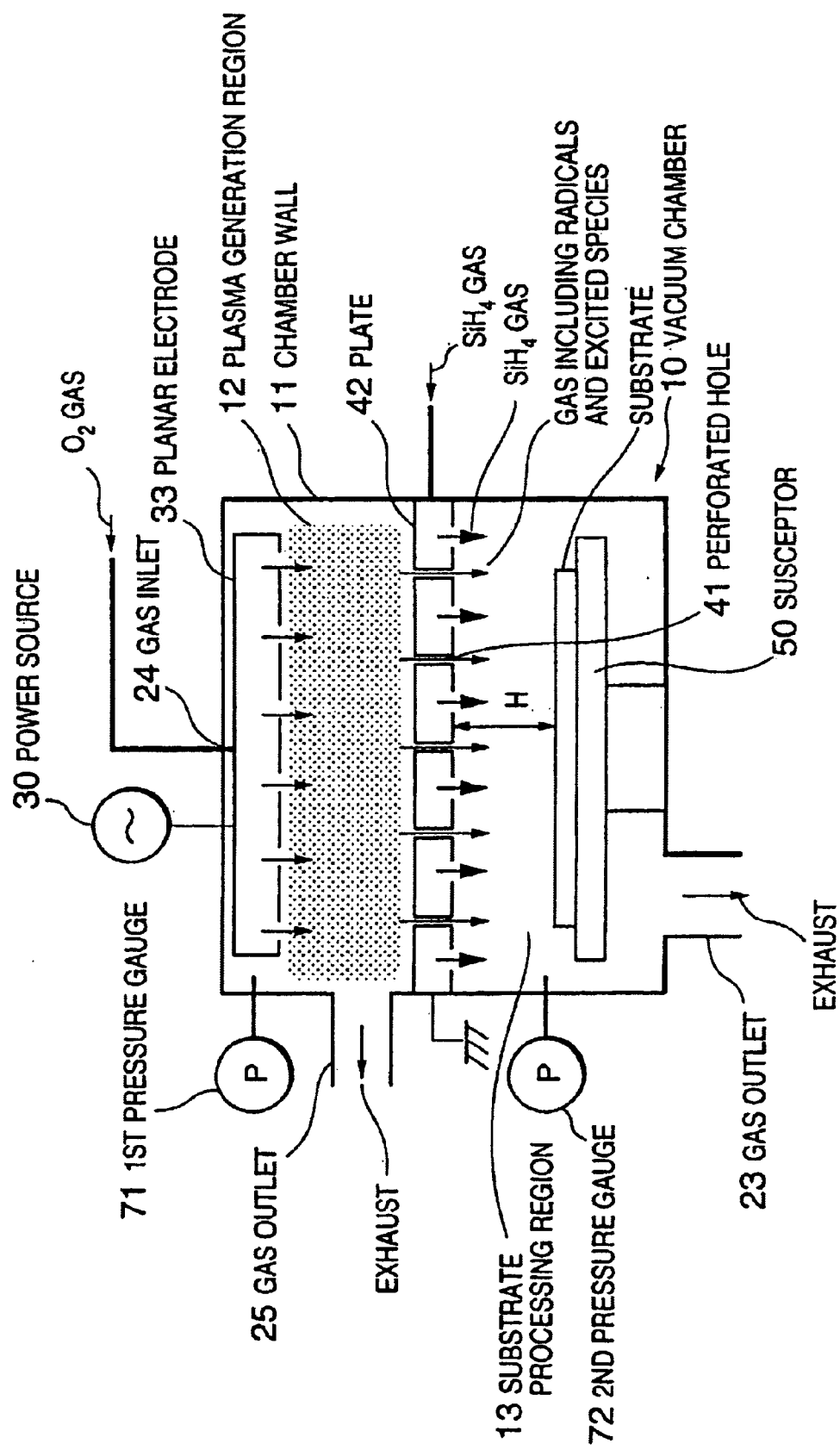
FIG. 13 is a schematic, vertical, cross-sectional view of a remote plasma apparatus, such as a remote plasma CVD apparatus, in accordance with another embodiment of the present invention.

Referring to FIG. 13, a remote plasma CVD apparatus according to another embodiment of the present invention comprises the similar structure of the remote plasma CVD apparatus depicted in FIG. 6 except for an exhaust mechanism. The remote plasma CVD apparatus illustrated in FIG. 13 further comprises a gas outlet 25 independent of the gas outlet 23, and first and second pressure gauges 71 and 72. The gas outlet 23 is arranged to communicate with the substrate processing region 13, while the gas outlet 25 is arranged to communicate with the plasma generation region 12. In addition, the gas outlet 23 and the gas outlet 25 are connected with first and second exhaust emission control devices or external vacuum pumps (not shown). The first and the second vacuum pumps is for controlling exhaust emissions independently of each other, and may comprise single exhaust emission control device if the exhaust of the gas outlet 23 and 25 can be independently controlled.

With the above structure, the pressure within the plasma generation region 12 and the pressure within the substrate processing region 13 can be controlled independently of each other if the former pressure becomes too high.

Figure 14:
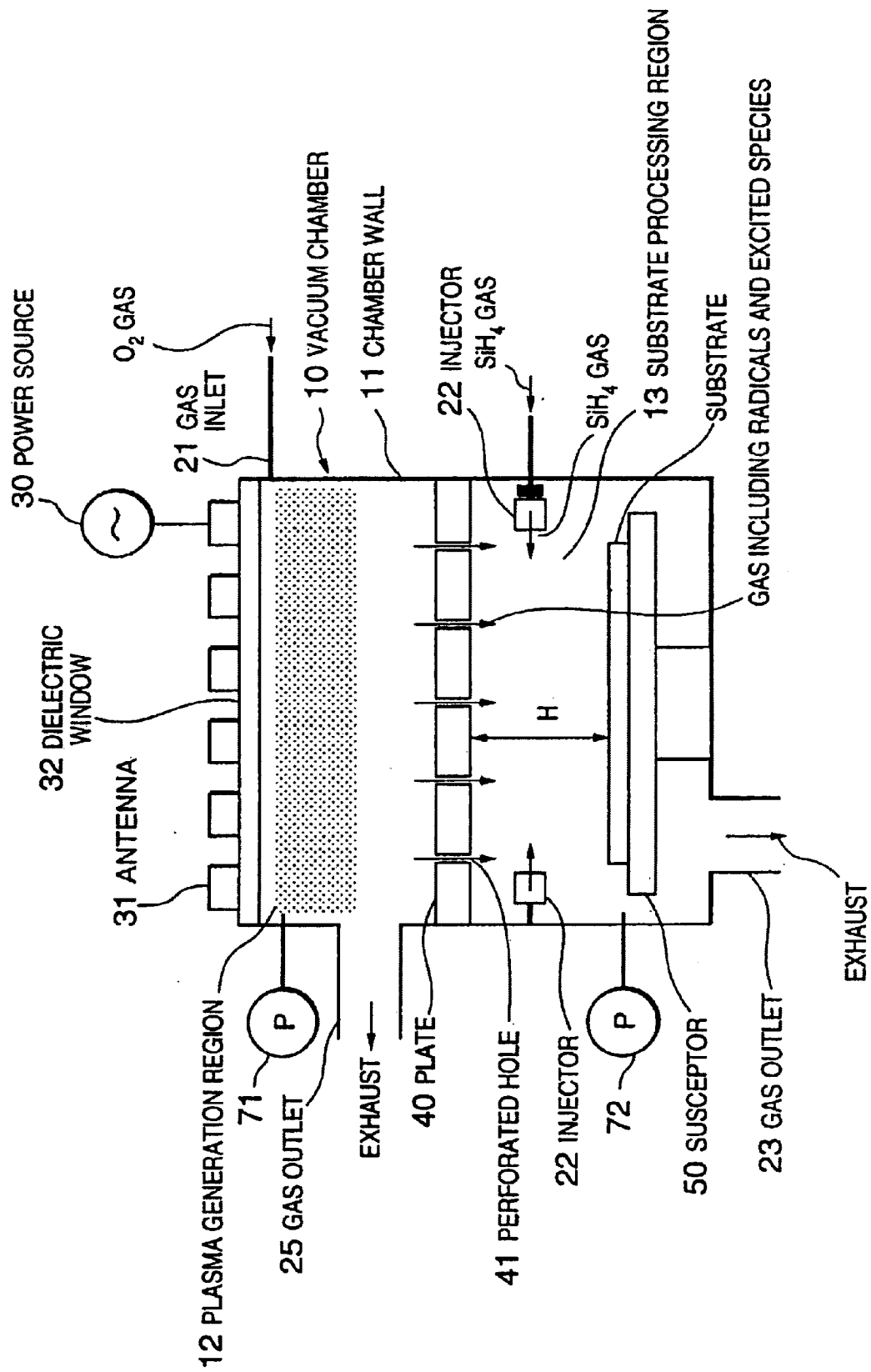
FIG. 14 is a schematic, vertical, cross-sectional view of a remote plasma apparatus, such as a remote plasma CVD apparatus, in accordance with another embodiment of the present invention.
Figure 15:
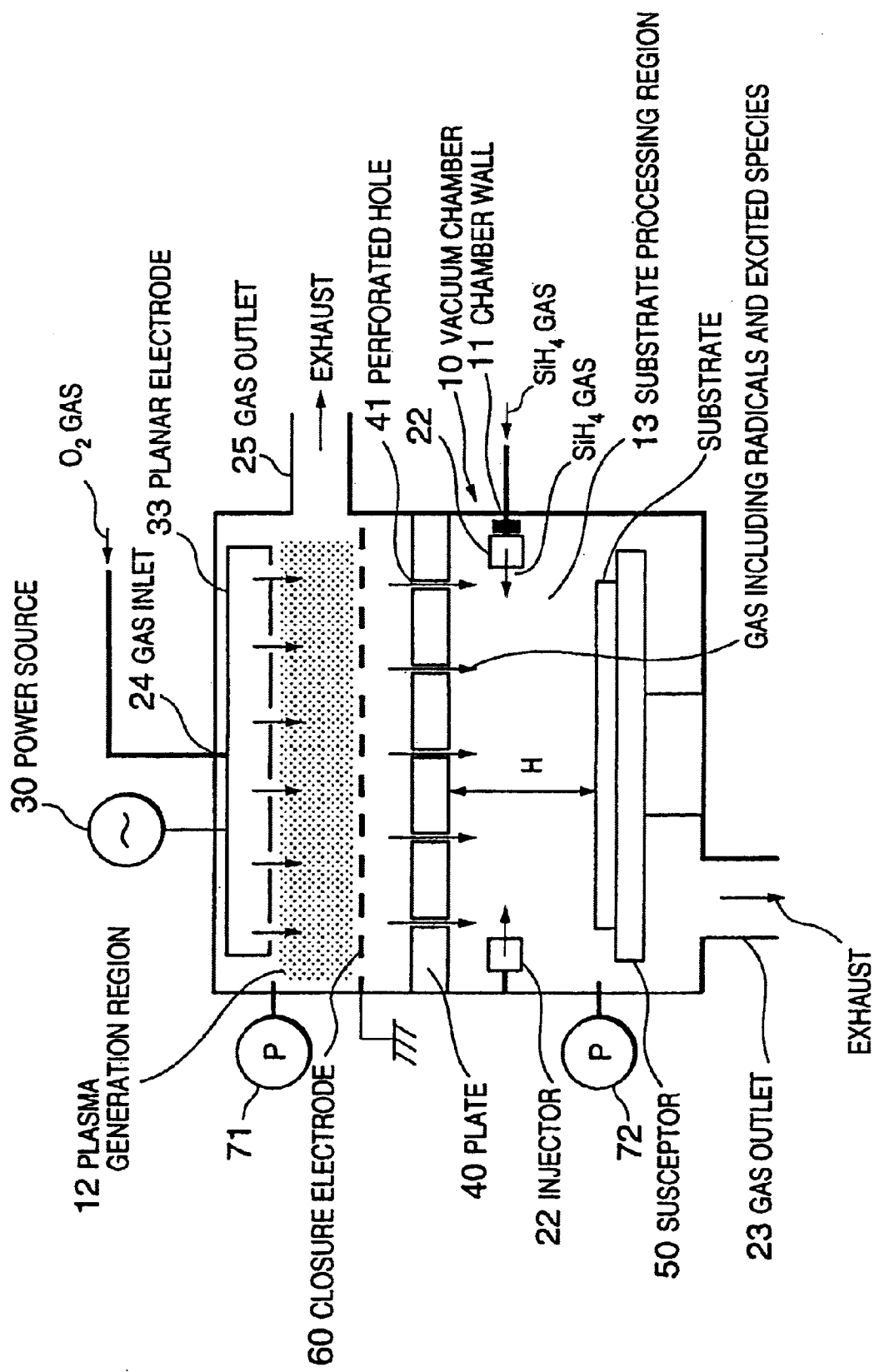
FIG. 15 is a schematic, vertical, cross-sectional view of a remote plasma apparatus, such as a remote plasma CVD apparatus, in accordance with another embodiment of the present invention.
Figure 16:
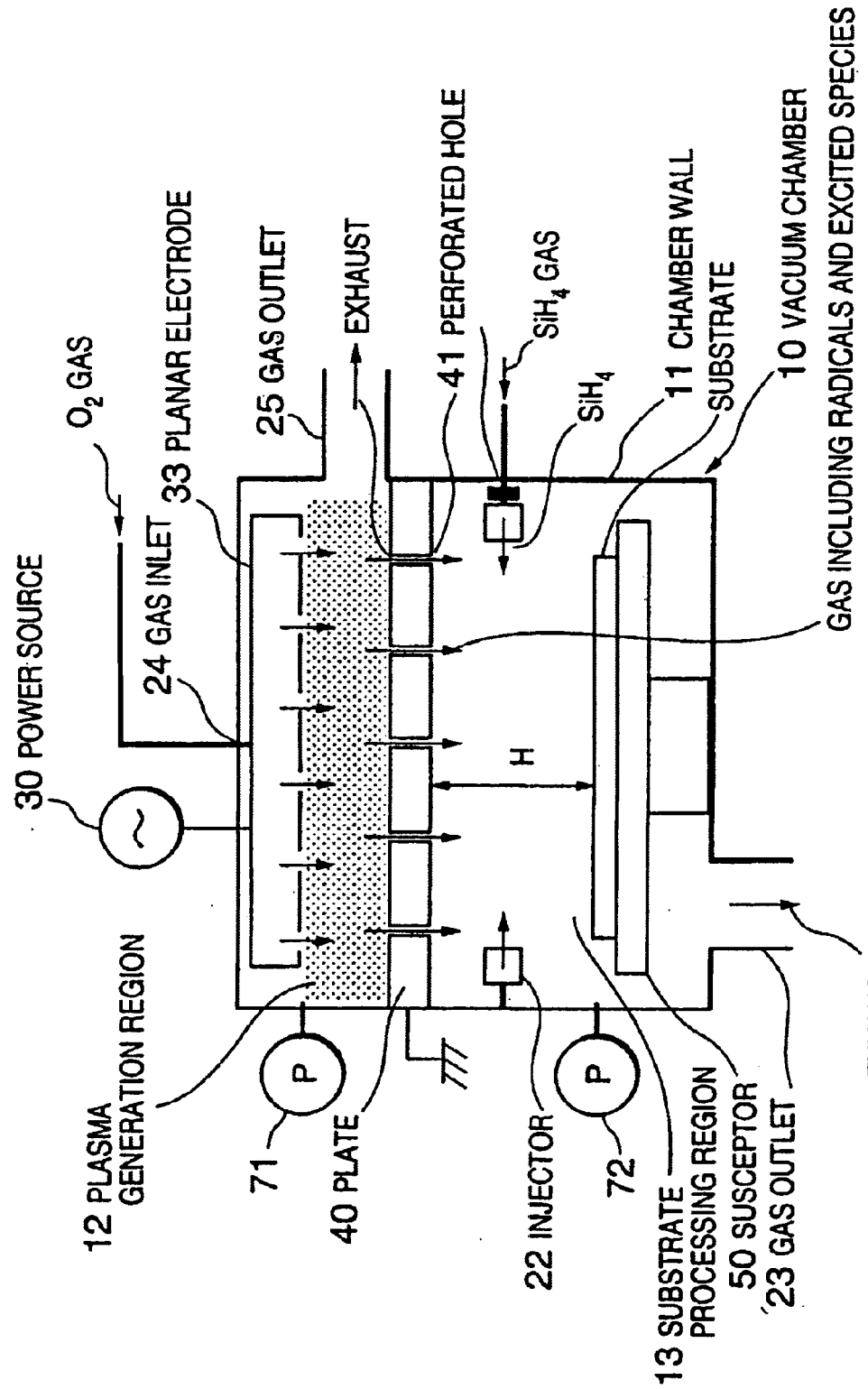
FIG. 16 is a schematic, vertical, cross-sectional view of a remote plasma apparatus, such as a remote plasma CVD apparatus, in accordance with another embodiment of the present invention.

As shown in FIGS. 14 through 16, similar modifications are applicable to the remote plasma CVD apparatuses illustrated in FIGS. 1, 4, and 5, respectively.

It is to be understood that the above description is intended to be illustrative and not restrictive. Many embodiments and the combinations thereof will be apparent to those of skill in the art upon reviewing the above description. For example, a monosilane injector according to the above-mentioned embodiments is a ring-shaped injector or a plate as a gas distribution structure, but the present invention is not so limited. Those skilled in the art will recognize other equivalent of alternative injection mechanism, such as a frame-shaped injector, a latticed-pipe injector, and a straight pipe injector. In the above-mentioned embodiment, methods of forming silicon dioxide films are described, but this invention can apply to a method of forming another film, such as a silicon nitride (Si$_3$N$_4$) film or a amorphous silicon (a-Si) film. For example, the former film is made from a monosilane gas and an ammonium hydroxide gas, while the latter film is made from a monosilane gas and a rare gas or a hydrogen gas. In addition, although the induction coupled remote plasma CVD apparatus and the parallel plate remote plasma CVD apparatus are described in the above-mentioned embodiments, this invention can apply to other type of apparatuses, such as a CVD apparatus with a microwave source or an electron cyclotron resonance (ECR) source, or another CVD apparatus handling inductive coupled plasma or helicon wave plasma.

What is claimed is:

1. A remote plasma apparatus comprising:

a body defining a cavity and having first and second inlets, the cavity comprising a plasma generation region and a processing region, the first inlet communicating with the plasma generation region to introduce a first gas into the plasma generation region, the second inlet communicating with the processing region to supply a second gas into the processing region;

an energy source arranged and adapted to apply energy within the plasma generation region to generate, from the first gas, plasma including radicals;

a plate arranged in the cavity and dividing the cavity between the plasma generation region and the processing region, the plate being formed with a plurality of perforated holes which the radicals pass through and each of which has a diameter not larger than three millimeters, wherein aperture ratio of the perforated holes area to the plate area is not greater than five percent, so as to avoid diffusion of the second gas from the processing region to the plasma generation region and as a result, to suppress backward flow of said second gas into said plasma generation region; and a substrate supporter arranged within the processing region and adapted to support a substrate to be processed by using a reaction between the radicals passing through the perforated holes and the second gas supplied through the second inlet.

2. A remote plasma apparatus comprising:

a body defining a cavity and having first and second inlets, the cavity comprising a plasma generation region and a processing region, the first inlet communicating with the plasma generation region to introduce a first gas into the plasma generation region, the second inlet communicating with the processing region to supply a second gas into the processing region;

an energy source arranged and adapted to apply energy within the plasma generation region to generate, from the first gas, plasma including radicals;

a plate arranged in the cavity and dividing the cavity between the plasma generation region and the processing region, the plate being formed with a plurality of perforated holes which the radicals pass through and each of which has a diameter not larger than three millimeters, wherein aperture ratio of the perforated holes area to the plate area is not greater than five percent, so as to avoid diffusion of the second gas from the processing region to the plasma generation region and as a result, to suppress backward flow of said second gas into said plasma generation region; and a substrate supporter arranged within the processing region and adapted to support a substrate to be processed by using a reaction between the radicals passing through the perforated holes and the second gas supplied through the second inlet.

3. A remote plasma apparatus as claimed in claim 2, wherein the body further has first and second outlets which communicate between an outside of the remote plasma apparatus and the plasma generation region and the processing region, respectively.

4. A remote plasma apparatus as claimed in claim 2, wherein:

the plate comprises, to define a gas supplier plenum, a top portion having a plurality of upper holes, a bottom portion having a plurality of lower holes, a plurality of tube walls connecting between the upper holes and the lower holes, respectively, and a plurality of gas injection holes communicating with the processing region;

the tube walls form the perforated holes and separate the gas supplier plenum from insides of the perforated holes, respectively; and the second inlet is connected to the gas supplier plenum so as to communicate with the processing region through the gas supplier plenum and the gas injection holes.

5. A remote plasma apparatus comprising:

a body defining a cavity and having first and second inlets and an inner side wall, the cavity comprising a plasma generation region and a processing region, the first inlet communicating with the plasma generation region to introduce a first gas into the plasma generation region, the second inlet communicating with the processing region to supply a second gas into the processing region;

an energy source arranged and adapted to apply energy within the plasma generation region to generate, from the first gas, plasma including radicals;

a plate arranged in the cavity and dividing the cavity between the plasma generation region and the processing region with no gap left between the plate and the inner side wall, the plate being formed with a plurality of perforated holes which the radicals pass through and each of which has a diameter not larger than three millimeters, wherein aperture ratio of the perforated holes area to the plate area is not greater than five percent, so as to avoid diffusion of the second gas from the processing region to the plasma generation region and as a result, to suppress backward flow of said second gas into said plasma generation region; and a substrate supporter arranged within the processing region and adapted to support a substrate to be processed by using a reaction between the radicals passing through the perforated holes and the second gas supplied through the second inlet.

6. A remote plasma apparatus as claimed in claim 5, wherein the body further has first and second outlets which communicate between an outside of the remote plasma apparatus and the plasma generation region and the processing region, respectively.

7. A remote plasma apparatus as claimed in claim 5, wherein:

the plate comprises, to define a gas supplier plenum, a top portion having a plurality of upper holes, a bottom portion having a plurality of lower holes, a plurality of tube walls connecting between the upper holes and the lower holes, respectively, and a plurality of gas injection holes communicating with the processing region;

the tube walls form the perforated holes and separate the gas supplier plenum from insides of the perforated holes, respectively; and the second inlet is connected to the gas supplier plenum so as to communicate with the processing region through the gas supplier plenum and the gas injection holes.

8. A remote plasma apparatus comprising:

a body defining a cavity and having first and second inlets, the cavity comprising a plasma generation region and a processing region, the first inlet communicating with the plasma generation region to introduce a first gas into the plasma generation region, the second inlet communicating with the processing region to supply a second gas into the processing region;

an energy source arranged and adapted to apply energy within the plasma generation region to generate, from the first gas, plasma including radicals;

a closure electrode arranged within the cavity and defining the plasma generation region in cooperation with the body, the closure electrode being electrically grounded to allow the radicals to pass through the closure electrode;

a plate arranged in the cavity and dividing the cavity and defining the processing region in cooperation with the body, the plate being formed with a plurality of perforated holes which the radicals pass through and each of which has a diameter not larger than three millimeters, wherein aperture ratio of the perforated holes area to the plate area is not greater than five percent, so as to avoid diffusion of the second gas from the processing region to the plasma generation region and as a result, to suppress backward flow of said second gas into said plasma generation region; and a substrate supporter arranged within the processing region and adapted to support a substrate to be processed by using a reaction between the radicals passing through the perforated holes and the second gas supplied through the second inlet.

9. A remote plasma apparatus as claimed in claim 8, wherein the body further has first and second outlets which communicate between an outside of the remote plasma apparatus and the plasma generation region and the processing region, respectively.

10. A remote plasma apparatus as claimed in claim 9, wherein:

the plate comprises, to define a gas supplier plenum, a top portion having a plurality of upper holes, a bottom portion having a plurality of lower holes, a plurality of tube walls connecting between the upper holes and the lower holes, respectively, and a plurality of gas injection holes communicating with the processing region;

the tube walls form the perforated holes and separate the gas supplier plenum from insides of the perforated holes, respectively; and the second inlet is connected to the gas supplier plenum so as to communicate with the processing region through the gas supplier plenum and the gas injection holes.

11. A remote plasma apparatus comprising:

a body defining a cavity and having first and second inlets and an inner side wall, the cavity comprising a plasma generation region and a processing region, the first inlet communicating with the plasma generation region to introduce a first gas into the plasma generation region, the second inlet communicating with the processing region to supply a second gas into the processing region;

an energy source arranged and adapted to apply energy within the plasma generation region to generate, from the first gas, plasma including radicals;

a closure electrode arranged within the cavity and defining the plasma generation region in cooperation with the body, the closure electrode being electrically grounded to allow the radicals to pass through the closure electrode;

a plate arranged in the cavity and dividing the cavity with no gap left between the plate and the inner side wall so as to define the processing region, the plate being formed with a plurality of perforated holes which the radicals pass through and each of which has a diameter not larger than three millimeters, wherein aperture ratio of the perforated holes area to the plate area is not greater than five percent, so as to avoid diffusion of the second gas from the processing region to the plasma generation region and as a result, to suppress backward flow of said second gas into said plasma generation region; and a substrate supporter arranged within the processing region and adapted to support a substrate to be processed by using a reaction between the radicals passing through the perforated holes and the second gas supplied through the second inlet.

12. A remote plasma apparatus as claimed in claim 11, wherein the body further has first and second outlets which communicate between an outside of the remote plasma apparatus and the plasma generation region and the processing region, respectively.

13. A remote plasma apparatus as claimed in claim 11, wherein:

the plate comprises, to define a gas supplier plenum, a top portion having a plurality of upper holes, a bottom portion having a plurality of lower holes, a plurality of tube walls connecting between the upper holes and the lower holes, respectively, and a plurality of gas injection holes communicating with the processing region;

the tube walls form the perforated holes and separate the gas supplier plenum from insides of the perforated holes, respectively; and the second inlet is connected to the gas supplier plenum so as to communicate with the processing region through the gas supplier plenum and the gas injection holes.

14. A remote plasma apparatus comprising:

a body defining a cavity and having first and second inlets, the cavity comprising a plasma generation region and a processing region, the first inlet communicating with the plasma generation region to introduce a first gas into the plasma generation region, the second inlet communicating with the processing region to supply a second gas into the processing region;

an energy source arranged and adapted to apply energy within the plasma generation region to generate, from the first gas, plasma including radicals;

a plate arranged in the cavity and dividing the cavity between the plasma generation region and the processing region, the plate being electrically grounded, the plate being formed with a plurality of perforated holes which the radicals pass through and each of which has a diameter not larger than three millimeters wherein aperture ratio of the perforated holes area to the plate area is not greater than five percent, so as to avoid diffusion of the second gas from the processing region to the plasma generation region and as a result, to suppress backward flow of said second gas into said plasma generation region; and a substrate supporter arranged within the processing region and adapted to support a substrate to be processed by using a reaction between the radicals passing through the perforated holes and the second gas supplied through the second inlet.

15. A remote plasma apparatus as claimed in claim 14, wherein the body further has first and second outlets which communicate between an outside of the remote plasma apparatus and the plasma generation region and the processing region, respectively.

16. A remote plasma apparatus as claimed in claim 14, wherein:

the plate comprises, to define a gas supplier plenum, a top portion having a plurality of upper holes, a bottom portion having a plurality of lower holes, a plurality of tube walls connecting between the upper holes and the lower holes, respectively, and a plurality of gas injection holes communicating with the processing region;

the tube walls form the perforated holes and separate the gas supplier plenum from insides of the perforated holes, respectively; and the second inlet is connected to the gas supplier plenum so as to communicate with the processing region through the gas supplier plenum and the gas injection holes.

17. A remote plasma apparatus comprising:

a body defining a cavity and having first and second inlets and an inner side wall, the cavity comprising a plasma generation region and a processing region, the first inlet communicating with the plasma generation region to introduce a first gas into the plasma generation region, the second inlet communicating with the processing region to introduce a second gas into the processing region;

an energy source arranged and adapted to apply energy within the plasma generation region to generate, from the first gas, plasma including radicals;

a plate arranged in the cavity and dividing the cavity between the plasma generation region and the processing region with no gap left between the plate and the inner side wall, the plate being electrically grounded, the plate being formed with a plurality of perforated holes which the radicals pass through and each of which has a diameter not larger than three millimeters, wherein aperture ratio of the perforated holes area to the plate area is not greater than five percent, so as to avoid diffusion of the second gas from the processing region to the plasma generation region and as a result, to suppress backward flow of said second gas into said plasma generation region; and a substrate supporter arranged within the processing region and adapted to support a substrate to be processed by using a reaction between the radicals passing through the perforated holes and the second gas supplied through the second inlet.

18. A remote plasma apparatus as claimed in claim 17, wherein the body further has first and second outlets which communicate between an outside of the remote plasma apparatus and the plasma generation region and the processing region, respectively.

19. A remote plasma apparatus as claimed in claim 17, wherein:

the plate comprises, to define a gas supplier plenum, a top portion having a plurality of upper holes, a bottom portion having a plurality of lower holes, a plurality of tube walls connecting between the upper holes and the lower holes, respectively, and a plurality of gas injection holes communicating with the processing region;

the tube walls form the perforated holes and separate the gas supplier plenum from insides of the perforated holes, respectively; and the second inlet is connected to the gas supplier plenum so as to communicate with the processing region through the gas supplier plenum and the gas injection holes.

20. A remote plasma apparatus comprising:

a body defining a cavity and having first and second inlets, the cavity comprising a plasma generation region and a processing region, the first inlet communicating with the plasma generation region to introduce a first gas into the plasma generation region, the second inlet communicating with the processing region to supply a second gas into the processing region;

an energy source arranged and adapted to apply energy within the plasma generation region to generate, from the first gas, plasma including radicals;

a plate arranged in the cavity and dividing the cavity between the plasma generation region and the processing region, the plate being formed with a plurality of perforated holes which the radicals pass through and each of which has a diameter not larger than three millimeters, wherein neighboring ones of the perforated holes have a predetermined interval therebetween, and wherein aperture ratio of the perforated holes area to the plate area is not greater than five percent, so as to avoid diffusion of the second gas from the processing region to the plasma generation region and as a result, to suppress backward flow of said second gas into said plasma generation region; and a substrate supporter arranged within the processing region and adapted to support a substrate to be processed by using a reaction between the radicals passing through the perforated holes and the second gas supplied through the second inlet, so that the predetermined interval is shorter than another interval between the plate and the substrate to be processed when the substrate is supported by the substrate supporter.

21. A remote plasma apparatus as claimed in claim 20, wherein the body further has first and second outlets which communicate between an outside of the remote plasma apparatus and the plasma generation region and the processing region, respectively.

22. A remote plasma apparatus as claimed in claim 20, wherein:

the plate comprises, to define a gas supplier plenum, a top portion having a plurality of upper holes, a bottom portion having a plurality of lower holes, a plurality of tube walls connecting between the upper holes and the lower holes, respectively, and a plurality of gas injection holes communicating with the processing region;

the tube walls form the perforated holes and separate the gas supplier plenum from insides of the perforated holes, respectively; and the second inlet is connected to the gas supplier plenum so as to communicate with the processing region through the gas supplier plenum and the gas injection holes.

23. A remote plasma apparatus comprising:

a body defining a cavity and having first and second inlets and an inner side wall, the cavity comprising a plasma generation region and a processing region, the first inlet communicating with the plasma generation region to introduce a first gas into the plasma generation region, the second inlet communicating with the processing region to supply a second gas into the processing region;

an energy source arranged and adapted to apply energy within the plasma generation region to generate, from the first gas, plasma including radicals;

a plate arranged in the cavity and dividing the cavity between the plasma generation region and the processing region with no gap left between the plate and the inner side wall, the plate being formed with a plurality of perforated holes which the radicals pass through and each of which has a diameter not larger than three millimeters, wherein neighboring ones of the perforated holes have a predetermined interval therebetween, and wherein aperture ratio of the perforated holes area to the plate area is not greater than five percent, so as to avoid diffusion of the second gas from the processing region to the plasma generation region and as a result, to suppress backward flow of said second gas into said plasma generation region; and a substrate supporter arranged within the processing region and adapted to support a substrate to be processed by using a reaction between the radicals passing through the perforated holes and the second gas supplied through the second inlet, so that the predetermined interval is shorter than another interval between the plate and the substrate to be processed when the substrate is supported by the substrate supporter.

24. A remote plasma apparatus as claimed in claim 23, wherein the body further has first and second outlets which communicate between an outside of the remote plasma apparatus and the plasma generation region and the processing region, respectively.

25. A remote plasma apparatus as claimed in claim 23, wherein:

the plate comprises, to define a gas supplier plenum, a top portion having a plurality of upper holes, a bottom portion having a plurality of lower holes, a plurality of tube walls connecting between the upper holes and the lower holes, respectively, and a plurality of gas injection holes communicating with the processing region;

the tube walls form the perforated holes and separate the gas supplier plenum from insides of the perforated holes, respectively; and the second inlet is connected to the gas supplier plenum so as to communicate with the processing region through the gas supplier plenum and the gas injection holes.

26. A remote plasma apparatus comprising:

a body defining a cavity and having first and second inlets and first and second outlets, the cavity comprising a plasma generation region and a processing region, the first inlet communicating with the plasma generation region to introduce a first gas into the plasma generation region, the second inlet communicating with the processing region to supply a second gas into the processing region, the first and the second outlets communicating between an outside of the remote plasma apparatus and the plasma generation region and the processing region, respectively;

an energy source arranged and adapted to apply energy within the plasma generation region to generate, from the first gas, plasma including radicals;

a plate arranged between the plasma generation region and the processing region, the plate being formed with a plurality of perforated holes which the radicals pass through and each of which has a diameter not larger than three millimeters, wherein aperture ratio of the perforated holes to the plate is not greater than five percent, so as to avoid diffusion of the second gas from the processing region to the plasma generation region and as a result, to suppress backward flow of the second gas into the plasma generation region; and a substrate supporter arranged within the processing region and adapted to support a substrate to be processed by using a reaction between the radicals passing through the perforated holes and the second gas supplied through the second inlet.

27. A remote plasma apparatus comprising:

a body defining a cavity and having first and second inlets, the cavity comprising a plasma generation region and a processing region, the first inlet communicating with the plasma generation region to introduce a first gas into the plasma generation region, the second inlet being adapted to supply a second gas into the processing region;

an energy source arranged and adapted to apply energy within the plasma generation region to generate, from the first gas, plasma including radicals;

a plate arranged between the plasma generation region and the processing region and comprising, to define a gas supplier plenum, a top portion having a plurality of upper holes, a bottom portion having a plurality of lower holes, a plurality of tube walls connecting between the upper holes and the lower holes, respectively, and a plurality of gas injection holes communicating with the processing region, the tube walls forming a plurality of perforated holes which the radicals pass through and each of which has a diameter not larger than three millimeters; and separating the gas supplier plenum from insides of the perforated holes, respectively, the gas supplier plenum of the plate being connected to the second inlet so that the second inlet communicates with the processing region through the gas supplier plenum and the gas injection holes, wherein aperture ratio of the perforated holes to the plate is not greater than five percent, so as to avoid diffusion of the second gas from the processing region to the plasma generation region and as a result, to suppress backward flow of the second gas into the plasma generation region; and a substrate supporter arranged within the processing region and adapted to support a substrate to be processed by using a reaction between the radicals passing through the perforated holes and the second gas supplied through the second inlet.

* * * * *